United States Patent [19]
Sun et al.

[11] Patent Number: 5,886,370
[45] Date of Patent: Mar. 23, 1999

[54] EDGE-EMITTING SEMICONDUCTOR LASERS

[75] Inventors: Decai Sun; Philip D. Floyd, both of Sunnyvale, Calif.

[73] Assignee: Xerox Corporation, Stamford, Conn.

[21] Appl. No.: 864,803

[22] Filed: May 29, 1997

[51] Int. Cl.[6] .................................................. H01L 33/00
[52] U.S. Cl. ............................... 257/94; 257/96; 257/98; 257/102; 372/45; 372/46
[58] Field of Search .................................. 257/12, 13, 94, 257/96, 98, 102; 372/45, 46, 90, 49

[56] References Cited

U.S. PATENT DOCUMENTS

| | | | |
|---|---|---|---|
| 5,071,786 | 12/1991 | Paoli ....................................... | 437/129 |
| 5,262,360 | 11/1993 | Holonyak, Jr. et al. ................ | 437/237 |
| 5,327,448 | 7/1994 | Holonyak, Jr. et al. .................. | 372/94 |
| 5,376,583 | 12/1994 | Northrup et al. ........................ | 437/133 |
| 5,386,428 | 1/1995 | Thornton et al. .......................... | 372/50 |
| 5,719,891 | 2/1998 | Jewell ....................................... | 372/45 |

OTHER PUBLICATIONS

Beernink et al., "Differential Al–Ga interdiffusion in AlGaAs/GaAs and AlGaInP heterostructures," Appl. Phys. Lett. 66 (26), 26 Jun. 1995, pp. 3597–3599.

Beernink et al., "Si diffusion and intermixing in AlGaAs/GaAs structures using buried impurity sources," Appl. Phys. Lett. 66 (19), 8 May 1995, pp. 2522–2524.

Caracci et al., "High–performance planar native–oxide buried–mesa index–guided AlGaAs–GaAs quantum well heterostructure lasers," Appl. Phys. Lett. 61 (3), 20 Jul. 1992, pp. 321–323.

Cheng et al., "Lasing Characteristics of High–Performance Narrow–Stripe InGaAs–GaAs Quantum–Well Lasers Confined by AlAs Native Oxide," IEEE Photonics Technology Letters, vol. 8. No. 2, Feb. 1996, pp. 176–178.

Choquette et al., "Threshold investigation of oxide–confined vertical–cavity laser diodes," App. Phys. Lett. 68 (26), 24 Jun. 1996, pp. 3689–3691.

Deppe et al., "Atom diffusion and impurity–induced layer disordering in quantum well III–V semiconductor heterostructures," J. Appl. Phys. 64 (12) 15 Dec. 1988, pp. R93–R113.

Floyd et al., "Comparison of Optical Losses in Dielectric–Apertured Vertical–Cavity Lasers," IEEE Photonics Technology Letters, vol. 8, No. 5, May 1996, pp. 590–592.

Fujii et al., "High–Power Operation of a Transverse–Mode Stabilised AlGaInP Visible Light ($\lambda_L$=683 nm) Semiconductor Laser," Electronics Letters, 27th Aug. 1987, vol. 23, No. 18, pp. 938–939.

Kish et al., "Properties and use of $In_{0.5}(Al_xGa_{1-x})_{0.5}P$ and $Al_xGa_{1-x}As$ Native Oxides in Heterostructure Lasers," Journal of Electronic Materials, vol. 21, No. 12, 1992, pp. 113–1139.

Lim et al., "Polarisation and modal behaviour of low threshold oxide and airgap confined vertical cavity lasers," Electronics Letters, 9th Nov. 1995, vol. 31, No. 23, pp. 2014–2015.

Meehan et al., "Disorder of an $Al_xGa_{1-x}As$–GaAs superlattice by donor diffusion," Appl. Phys. Lett. 45 (5), 1 Sep. 1984, pp. 549–551.

Sun et al., "Control of Wet–Oxidation of AlAs/GaAs Superlattices by Impurity–Induced Layer Disordering," 1997 Electronics Materials Conference, Jun. 25–17, 1997.

*Primary Examiner*—Minh Loan Tran

[57] ABSTRACT

The present invention relates to a laser with accurately defined and controlled oxide regions which provide electrical and optical confinement to the laser. Specifically, the oxide regions are formed by a pre-oxidation layer disordering process which defines the regions within which oxidation can occur. The present invention allows for the manufacture of highly compact lasers with reproducible optical and electrical characteristics.

24 Claims, 12 Drawing Sheets

EDGE-EMITTING SEMICONDUCTOR LASERS

CROSS REFERENCE TO RELATED APPLICATIONS

The present invention is related to commonly assigned and co-pending U.S. application entitled "Method of Controlling Oxidation in Semiconductor Materials," Ser. No. 08/756,663, filed on Nov. 26, 1996, invented by D. Sun and P. Floyd.

BACKGROUND OF THE INVENTION

1. Field of Invention

The present invention relates generally to lasers. More specifically, the invention relates to edge-emitting laser structures formed by a selective oxidation process.

2. Description of the Related Art

Solid state semiconductor lasers are important devices in applications such as optoelectronic communication systems and high speed printing systems. A common laser structure is a so-called "edge-emitting laser" whose reflective mirrors are typically formed along two side edges of a semiconductor sample. Generally, formation of native oxides in a laser is an important step to achieving good electrical and optical confinement in the structure. One approach in oxide formation is commonly known as the "surface-oxidation" technique. Examples of such an approach are described in U.S. Pat. No. 5,327,488 entitled "Semiconductor Devices and Techniques For Controlled Optical Confinement" and U.S. Pat. No. 5,262,360 entitled "AlGaAs Native Oxide," both of which were invented by Holonyak et al. As discussed in these patents, under the "surface-oxidation" approach, a cap GaAs layer is placed above a thick AlGaAs layer with a high aluminum content, which is deposited above the active layer of a laser structure. Under this "surface-oxidation" approach, the surface of the sample is first patterned with silicon nitride, protecting and exposing parts of the GaAs cap layer. The exposed GaAs areas are then removed by chemical etching exposing the underlying AlGaAs layer which has a high aluminum content. The sample is then oxidized in water vapor where the oxidation in the AlGaAs layer proceeds downwards from the surface until it reaches the active layer which has a lower aluminum content. Since the active layer has a lower aluminum content, the oxidation process essentially stops when it reaches the active layer, providing electrical and optical confinement to the laser structure.

A disadvantage of the "surface-oxidation" technique is that it is sensitive to fluctuations in the fabrication process. For instance, the oxidation rate is dependent upon variations in the aluminum composition and the processing temperature. This dependency creates reproducibility and uniformity issues in the performance of the devices. In addition, this technique may not be applicable to other solid state semiconductor lasers such as vertical cavity surface emitting lasers ("VCSEL's"), which has alternate AlGaAs layers of high and low aluminum content in an upper internal reflector.

Another approach towards forming oxides is a so-called "buried-layer" oxidation approach which is described in "Lasing Characteristics of High-Performance Narrow Stripe InGaAs-GaAs Quantum-Well Lasers Confined by AlAs Native Oxide," IEEE Photonics Technology Letters, vol. 8, No. 2, p. 176 (February 1996) by Cheng et al. Under this approach, an AlAs layer is placed above and below the active layer of a laser structure. Then, grooves are etched, forming a stripe mesa structure in between the grooves. As a result of the etching, the AlAs layers sandwiching the active layer are exposed along the sidewalls of the mesa. During an oxidation process, these AlAs layers are oxidized laterally from the sidewalls of the mesa towards the center of the mesa. However, other layers in the structure remain essentially unoxidized since their aluminum content is lower. The oxidized AlAs layers reduce the effective refractive index of the regions both above and underneath them, providing lateral electrical and optical confinement to the sandwiched active layer. Another discussion regarding the "buried-layer" technique is described in "High-Performance Planar Native-Oxide Buried-Mesa Index-Guided AlGaAs-GaAs Quantum Well Heterostructure Lasers," Appl. Phys. Lett. vol. 61 (3), p. 321 (July 1992) by Smith et al.

Similar to the "surface-oxidation" technique, a key disadvantage of the "buried-layer" approach is the difficulty in controlling the amount of oxidation. Because the oxidation rate of AlAs or AlGaAs with a high aluminum content depends upon aluminum composition and process variations, any variation in aluminum composition or process parameters will be reflected by changes in the oxidation rate, which in turn creates uncertainty in the amount of oxidation. The process is relatively temperature-sensitive. Therefore, when such a technique is applied to forming lasers, the devices typically have manufacturability and yield problems.

Accordingly, there is a need for developing a laser with accurately defined and controlled oxide regions which provide electrical and optical confinement.

BRIEF SUMMARY OF INVENTION

The present invention provides an approach to building an edge-emitting laser comprising of (i) a substrate, (ii) a plurality of contiguous semiconductor layers on the substrate, one of which is the active layer, (iii) a pair of regions sandwiching the active layer to provide optical and carrier confinement in a direction perpendicular to the surface of the substrate; (iv) a first lateral waveguiding region formed by a first oxidized region and a second lateral waveguiding region formed by a second oxidized region, (v) a first electrode which contacts a layer above the active layer, and (vi) a second electrode which contacts a layer below the active layer. The first and second lateral waveguiding regions provide confinement of the optical field in the edge-emitting laser in a direction parallel to the surface of the substrate. In this edge-emitting laser, the distance between the first and second lateral waveguiding regions is defined by an intermixed region.

DETAILED DESCRIPTION OF PREFERRED EMBODIMENTS

Figure 1:
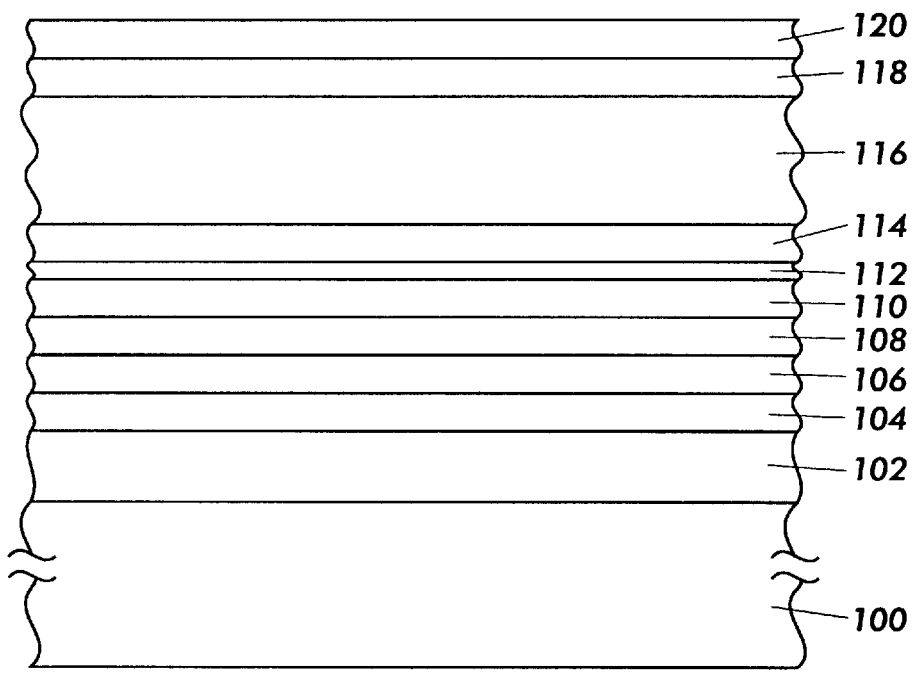
FIG. 1 illustrates a cross-sectional view of a semiconductor structure which is used to form an edge-emitting laser in accordance with the present invention.

FIG. 1 illustrates a semiconductor structure which is used to form an edge-emitting laser in accordance to the present invention. As stated previously, an edge-emitting laser generally has reflective mirrors formed along two side edges of a semiconductor structure. The structure illustrated includes a number of semiconductor layers. As shown in FIG. 1, an n-type AlGaAs lower cladding layer 102 is grown on an n-type GaAs substrate 100, for example, using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 102 range from 70 to 85 percent and 1 to $5 \times 10^{18}$ cm$^{-3}$ respectively. The thickness of the GaAs cladding layer 102 is approximately one micron ($\mu$m). The doping level of the n-type GaAs substrate 100 is approximately $5 \times 10^{18}$ cm$^{-3}$ or higher. Although not illustrated, a buffer layer may be deposited prior to the deposition of the lower cladding layer 102 in the event that lower throughputs are acceptable.

After the lower cladding layer 102 has been deposited, an n-type AlGaAs layer 104 of approximately 30 nanometers is formed. This AlGaAs layer 104 has a silicon doping level of approximately $5 \times 10^{18}$ cm$^{-3}$ and an aluminum mole fraction of approximately 40%. Afterwards, an AlAs layer 106 of about 30 nanometers is deposited, above which is another n-type AlGaAs layer 108 of about 30 nanometers. The silicon doping of the AlAs layer 106 as well as the two AlGaAs layers, 104 and 108, is approximately $5 \times 10^{18}$ cm$^{-3}$ or higher. The silicon acts as the disordering agent which enables intermixing by an impurity induced layer disordering (IILD) process. The AlGaAs layer 104, AlAs layer 106, and AlGaAs 108 form the embedded layers for the IILD process.

Above these three embedded layers, 104, 106, and 108, is an undoped AlGaAs lower confinement layer 110, which has an aluminum content of about 40% and a thickness of about 100 nanometers. After this lower confinement layer 110 has been deposited, a GaAs active layer 112 is deposited, which should result in a light emission at 840 nanometers. The active layer 106 may be a single quantum well, a multiple quantum well, or a layer with thickness greater than that of a quantum well. The thickness of a quantum well typically ranges from five to twenty nanometers. Above the active layer 112 is an undoped AlGaAs upper confinement layer 114. The aluminum content of this confinement layer 114 is typically 40%. The lower and upper confinement layers, 110 and 114, generally produce a laser structure with a lower threshold current and a smaller optical divergence.

After the upper confinement layer 114 has been formed, typically an AlGaAs upper cladding layer 116 of about one micron is deposited. Typically, this cladding layer 116 has an aluminum content of 70% and a magnesium doping level of $5 \times 10^{18}$ cm$^{-3}$. Upon the upper p-type AlGaAs cladding layer 116 is an AlGaAs layer 118, which typically has an aluminum composition of 40%, a thickness of 50 nanometers, and a magnesium doping level of approximately $5 \times 10^{18}$ cm$^{-3}$. This AlGaAs layer 118, along with a GaAs cap layer 120, facilitate the formation of ohmic contacts to the laser structure. The GaAs cap layer 120 is typically 100 nanometers with a magnesium doping of $1 \times 10^{19}$ cm$^{-3}$.

Figure 2:
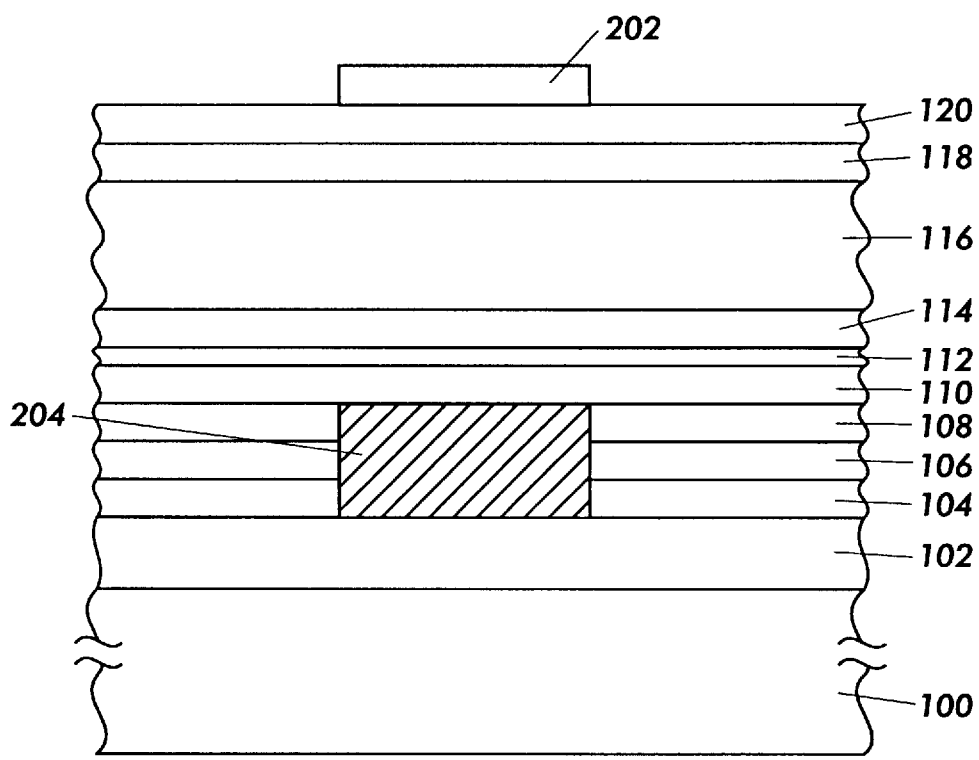
FIG. 2 illustrates a cross-sectional view of a laser structure shown in FIG. 1 with a region which has undergone a pre-oxidation layer disordering process.

After all the semiconductor layers shown in FIG. 1 have been deposited, a silicon nitride cap 202 is formed on the surface of the semiconductor sample as shown in FIG. 2. The embedded disordering agent is created by the dopants in the AlAs layer 106. During the IILD process, intermixing of the Group III elements, gallium and aluminum, occurs under the silicon nitride cap 202. The intermixing is mostly limited to the region underneath the silicon nitride cap 202. This nitride cap 202 has been shown to minimize the outdiffusion of arsenic and thus creates Group III vacancies by silicon diffusion. These vacancies created by silicon diffusion then enable the intermixing of Group III elements among the two AlGaAs layers, 104 and 108, as well as the AlAs layer 106.

It is well-known that IILD can be used to intermix Group III atoms in a III-V semiconductor heterostructure as shown in U.S. Pat. No. 5,386,428, entitled "Stacked Active Region Laser Array For Multicolor Emission," by Thornton et al. It is also well-known that zinc or beryllium diffused under gallium-rich or arsenic-deficient conditions can be used to produce p-type disordering. A discussion of such a process can be found in U.S. Pat. No. 5,376,583, entitled "Method for Producing P-Type Impurity Induced Layer Disordering" by Northrup et al. Therefore, impurity-induced layer intermixing using a variety of impurity sources is well known. Under this embodiment, a layer disordering process is used to define the regions within which oxidation can occur. In other words, a layer disordering process is performed prior to the oxidation process. During this pre-oxidation disordering process, the Group III elements of the layers in the heterostructure intermix, altering the aluminum composition of each layer.

During the intermixing process, the aluminum composition decreases in the layer which originally had a high aluminum content while the aluminum composition increases in the layer with a low aluminum content. After a typical IILD process, the region of the AlAs layer 106 under the silicon nitride mask 202 has an aluminum content of less than 100% while at the same time, regions under the silicon nitride mask 202 in the AlGaAs layers 104 and 108 have a higher aluminum content. This process depends upon the difference in the aluminum mole fractions of two regions— the region in which oxidation is desired and the region in which oxidation is not desired. In other words, this invention does not depend upon the absolute aluminum mole fractions of the two regions. Since the oxidation rates in aluminum-containing semiconductors generally depend upon the aluminum mole fraction in an exponential manner, this process tends to be very reproducible. Consequently, the yield of the lasers formed by the present invention should be higher.

The intermixing introduces gallium into or removes aluminum from the AlAs layer 106, thus lowering its aluminum mole fraction. Likewise, the intermixing introduces aluminum into or removes gallium from the AlGaAs layers 104 and 108, increasing their aluminum mole fractions. Minimal intermixing of Group III elements occurs under the areas not capped by silicon nitride 202 since inadequate Group III vacancies are generally generated in these areas. This approach allows for the intermixing of some interfaces without intermixing others above, below or next to them. The silicon nitride cap 202 is used to define the boundaries of the intermixed region 204 in a direction perpendicular to the surface of the substrate. Generally, it has been observed that a relatively sharp interface is created between the intermixed and the unintermixed region. Since the regions of the heterostructure which would be intermixed are defined by the placement of an embedded disordering agent in the structure, highly localized intermixing can be accomplished. Other sources which can cause layer disordering include other p- or n-type impurities as well as Group III or V vacancies.

Figure 3:
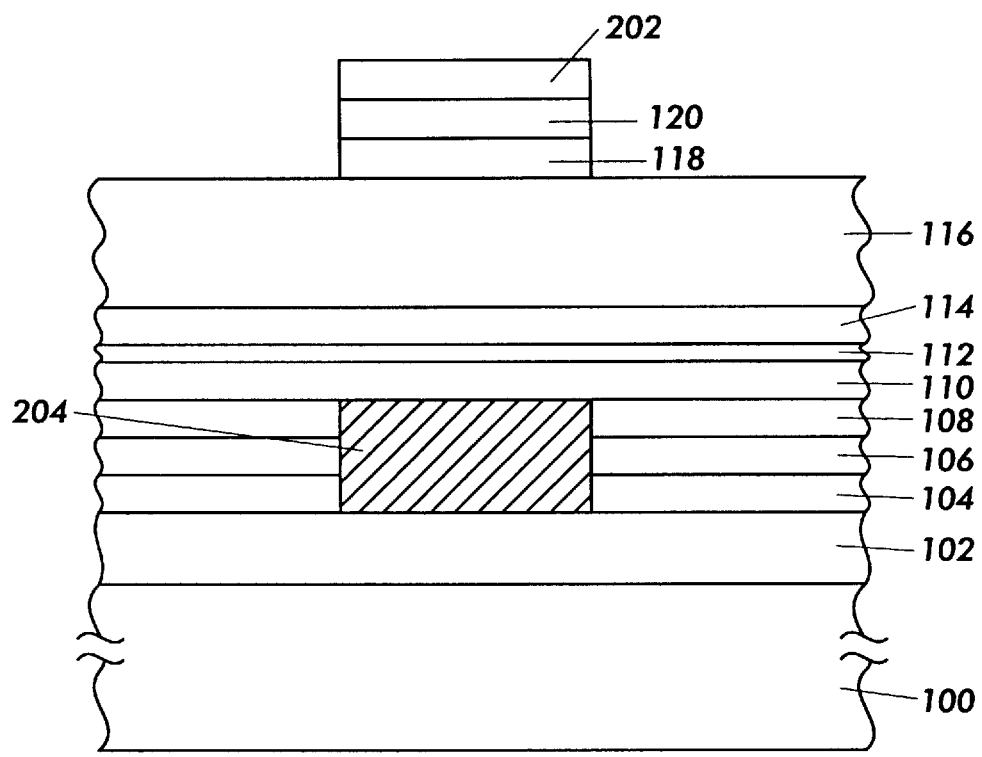
FIG. 3 illustrates a cross-sectional view of a laser structure shown in FIG. 2 with a region which has undergone a pre-oxidation layer disordering process and an etching process to remove the cap layers.

After the layer disordering process is completed, the p-type GaAs layer 120 and the p-type AlGaAs layer 118 are removed by an etching process in areas not protected by the silicon nitride cap 202. This etching process exposes the underlying AlGaAs layer 116 for a later oxidation process. The resulting structure after the etching process is shown in FIG. 3.

Figure 4:
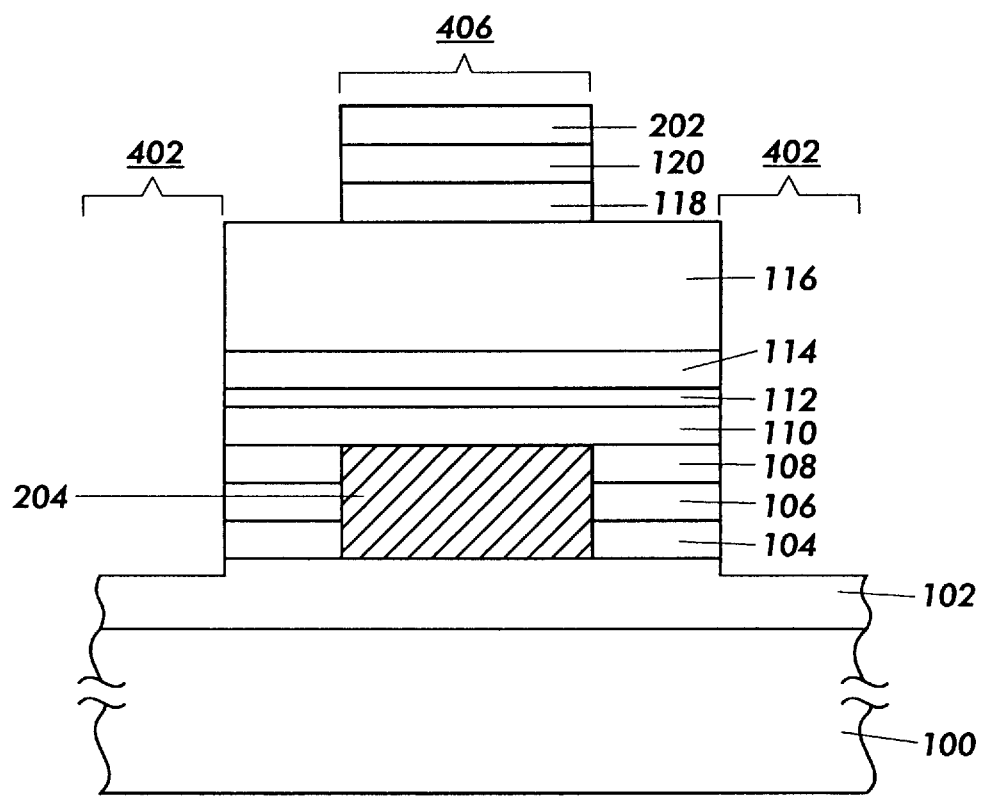
FIG. 4 illustrates a cross-sectional view of a laser structure shown in FIG. 3 with a region which has undergone an etching process which forms a mesa.

The semiconductor structure then undergoes another etching process to form grooves 402 as shown in FIG. 4. This etching step forms a mesa structure 406 and exposes the AlAs layer 106 along the sidewalls of the mesa 406. The structure then undergoes an oxidation step in an environment with water vapor at a temperature of 400° to 450° C. At this point, there exists a difference between the mole fraction of intermixed regions 204 of the AlAs layer 106 and the remaining unintermixed regions of the AlAs layer 106. The difference in aluminum mole fraction creates a disparity in the oxidation rates since the oxidation rate of AlGaAs depends exponentially upon the aluminum mole fraction. For instance, the oxidation rate of AlAs is about 1.5 $\mu$m per minute at 450° C. and is about 0.05 $\mu$m per minute for AlGaAs with about 80 percent aluminum. Due to this significant difference in the oxidation rates between the intermixed regions 204 and the remaining unintermixed regions of the AlAs layer 106, the oxidation process slows down substantially when it reaches the interface between the intermixed and unintermixed regions.

Figure 5:
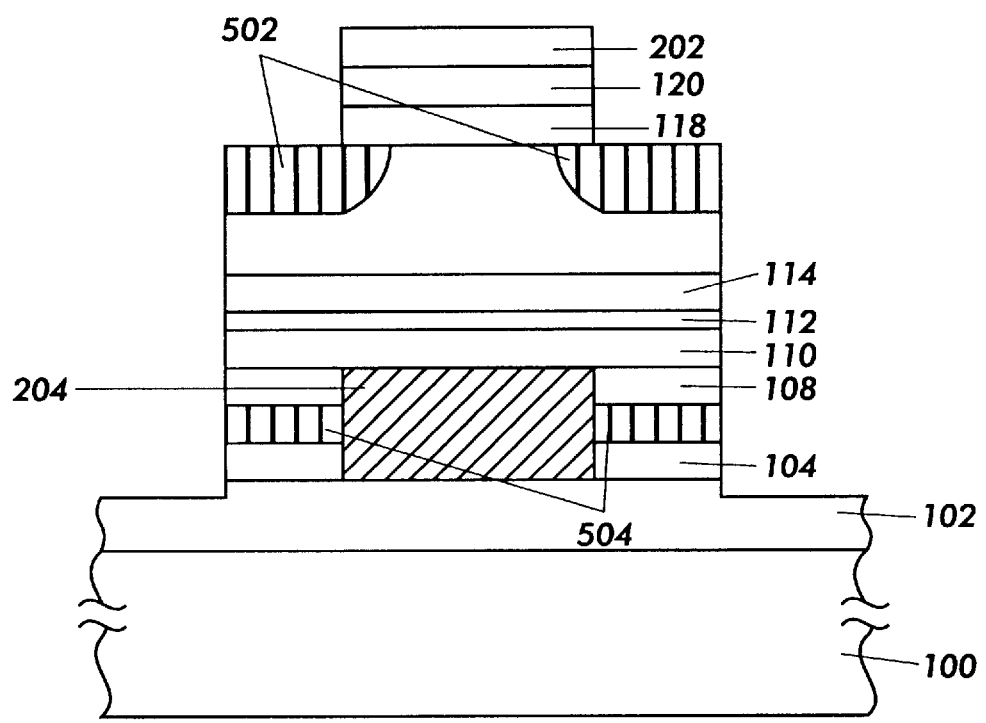
FIG. 5 illustrates a cross-sectional view of a laser structure FIG. 4 after it has undergone an oxidation process forming the oxide regions.

As shown in FIG. 5, this approach results in oxide formation in regions 504 of the AlAs layer as well as regions 502 in the surface. Oxide regions 502 improve the current confinement ability of the laser structure. The boundaries of regions 504 shown in FIG. 5 are defined by the AlGaAs layers 104 and 108 in the direction parallel to the surface of the substrate and by the silicon nitride cap 202 in the direction perpendicular to the surface of the substrate. In addition, these boundaries are relatively smooth and sharp as they are defined by an epitaxial growth process and a photolithography process. The spacing between the two oxide regions 504 are controlled by using a photolithography process. Since the photolithography process has a high degree of accuracy, the spacing between two oxide regions 504 can be minimal. Also, since these oxidized regions are defined after the epitaxial process has been completed, this approach allows for a high degree of process flexibility. Oxidized regions 504 serve as lateral waveguides. Hence, in this case, the spacing between the lateral waveguides are closely spaced and tightly controlled by the use of a region which has undergone a layer disordering process. Consequently, highly compact laser structures are formed.

Figure 6:
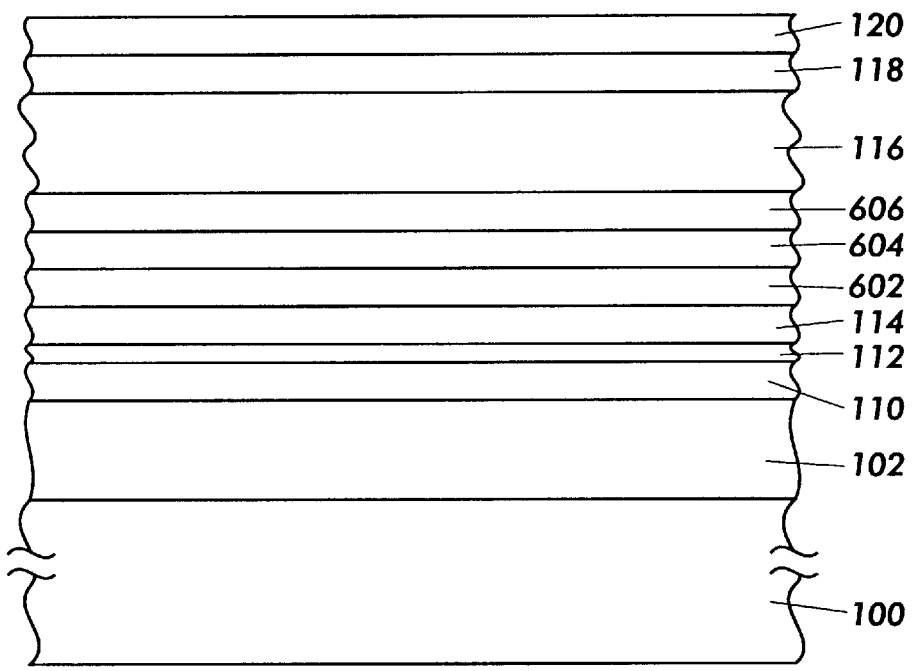
FIG. 6 illustrates a cross-sectional view of a semiconductor structure which is used to form an edge-emitting laser in accordance with an alternative embodiment of the present invention.

FIG. 6 shows an alternative embodiment which uses embedded layers doped with magnesium above the active layer 112. Other p-type dopants may also be used. Under this approach, since the oxidized regions of the embedded layers which determine the current path are above the active layer, current confinement is improved. Generally, if the oxidized regions are located in a p-type region, current spreading effects are minimized because of the shorter diffusion length or lower mobility of holes under these circumstances. As shown in FIG. 6, an n-type lower cladding layer 102, a lower confinement layer 110, an active layer 112, and an upper confinement layer 114 are deposited. After they have been deposited, an AlGaAs layer 602, an AlAs layer 604, and an AlGaAs layer 606 are formed, each of which has a magnesium doping of approximately $5 \times 10^{18}$ cm$^{-3}$ and a thickness of 30 nanometers The aluminum content of the two AlGaAs layers, 602 and 606, is typically 40 percent. These three embedded layers allow for intermixing of layers using a layer disordering process.

Figure 7:
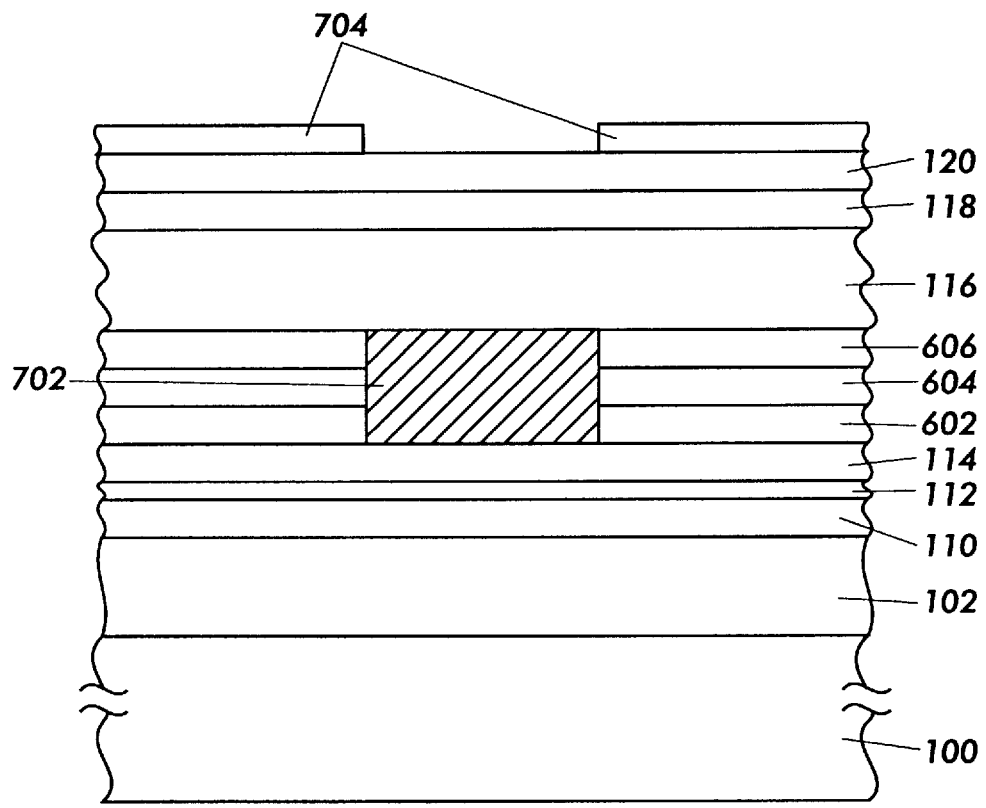
FIG. 7 illustrates a cross-sectional view of a laser structure shown in FIG. 6 which is used to implement an alternative embodiment of the present invention. It shows a region which has undergone a pre-oxidation layer disordering process.

To form a laser using the semiconductor structure of FIG. 6, silicon nitride caps 704 as shown in FIG. 7 are deposited above regions to be oxidized. In this case, since p-type dopants are used to induce layer disordering, the silicon nitride caps 704 cover the regions to be oxidized. In areas not covered by the silicon nitride caps 704, arsenic escapes from these areas, creating Group V vacancies or Group III interstitials or both. These Group V vacancies or Group III interstitials or both in turn induce the intermixing of Group III elements in a region 702 of the embedded layers, 602, 604, and 606. Generally, a relatively sharp interface is created between the intermixed and the unintermixed regions.

Figure 8:
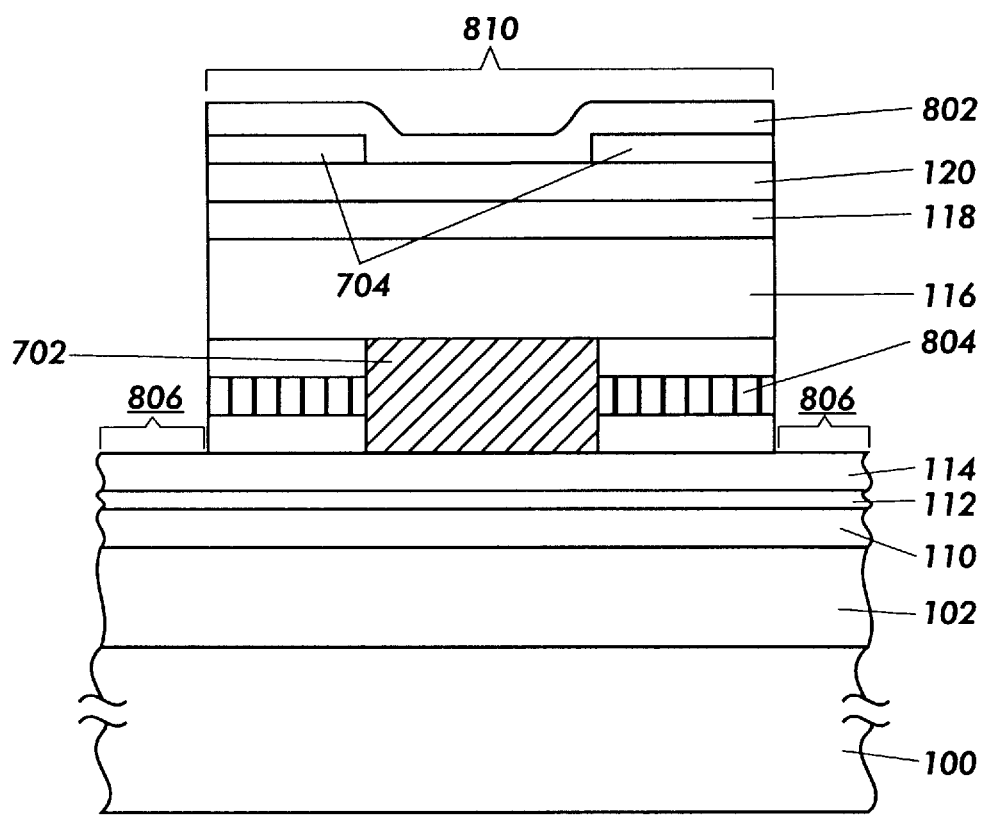
FIG. 8 illustrates a cross-sectional view of a laser structure shown in FIG. 7 which is used to implement an alternative embodiment of the present invention. It shows a region which has undergone an etching process which forms a mesa.

After the layer disordering process is completed, a silicon oxide layer 802 is deposited over the entire semiconductor sample as shown in FIG. 8. Then, the oxide layer 802 is patterned and etched, forming grooves 806. These grooves 806 form a mesa structure 810 and expose the AlAs layer along the sidewalls of the mesa 810. The sample then undergoes an oxidation step. The difference between the mole fraction of the intermixed regions 702 and all other regions which have not been intermixed creates a disparity in oxidation rates. The oxidation rate of AlGaAs depends exponentially upon the aluminum mole fraction. Due to this significant difference in the oxidation rates between the intermixed regions 702 and the remaining unintermixed regions, the oxidation process slows down substantially when it reaches the interface between the intermixed and unintermixed regions. As shown in FIG. 8, this approach results in oxide formation in regions 804. The boundaries of these regions 804 are defined by the AlGaAs layers 602 and 606 in the direction parallel to the surface of the substrate and by the silicon nitride caps 704 in the direction perpendicular to the surface of the substrate. These boundaries are relatively smooth and sharp as they are defined by an epitaxial growth process or a photolithography process.

Figure 9:
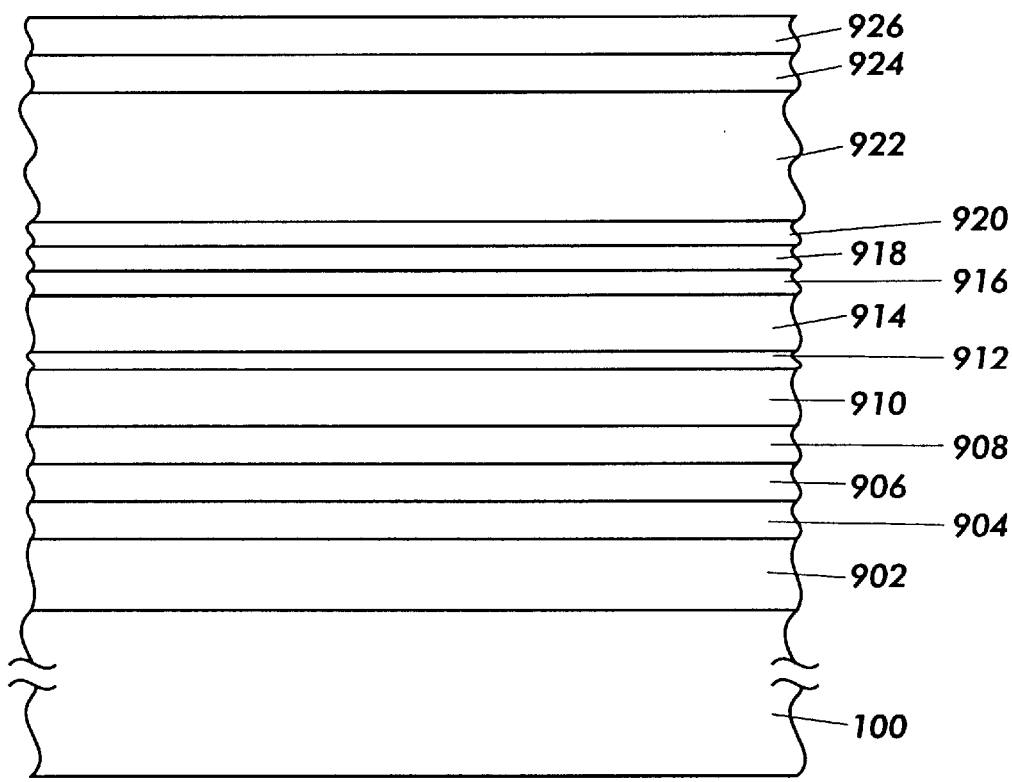
FIG. 9 illustrates a cross-sectional view of a semiconductor structure which is used to form an edge-emitting laser in accordance with another alternative embodiment of the present invention.

FIG. 9 illustrates an alternative semiconductor structure which is used to form another embodiment of the present invention. As shown in FIG. 9, an n-type AlInP cladding layer 902 of approximately one micron is grown on an n-type GaAs substrate 100 using metal-organic chemical vapor deposition. The AlInP cladding layer 902 has an aluminum mole fraction of approximately 50% and a doping level ranging from 1 to $5 \times 10^{18}$ cm$^{-3}$.

After the cladding layer 902 has been deposited, an undoped AlGaAs layer 904, an undoped AlAs layer 906, and another undoped AlGaAs layer 908, form one set of the embedded layers in the semiconductor structure. These layers may be n-type or undoped. The aluminum mole fraction of the embedded AlGaAs layers, 904 and 908, is typically 60 percent, which results in a material that is non-absorptive to red emission. The thickness of each of the embedded layers, 904, 906, and 908, is approximately 30 nanometers. This lower set of embedded layers allows for the intermixing of layers using layer disordering.

Above these three embedded layers, 904, 906, and 908, is an $(Al_{0.6}Ga_{0.4})_{0.5}In_{0.5}P$ lower confinement layer 910 which is about 100 nanometers in thickness. The indium content of this layer 910 is approximately 50%. After this lower confinement layer 910 has been deposited, an undoped active layer 912 made of InGaP is deposited. The active layer 912, which produces an output emission of about 670 nm, may be a single quantum well, a multiple quantum well, or a layer with thickness greater than that of a quantum well. The thickness of a quantum well is typically 5 to 20 nm. Above the active layer 912 is an undoped upper $(Al_{0.6}Ga_{0.4})_{0.5}In_{0.5}P$ confinement layer 914. This upper confinement layer 914 has an indium content of typically 50%.

After the upper confinement layer 914 has been formed, another set of embedded layers is deposited. This set of layers comprises an undoped AlGaAs layer 916, an undoped AlAs layer 918, and an undoped AlGaAs layer 920. Each of the three embedded layers, 916, 918, and 920, is approximately 30 nanometers. The aluminum mole fraction of the embedded AlGaAs layers, 916 and 920, is typically 60 percent. Again, these three embedded layers allow for the intermixing of layers using an impurity induced layer disordering process. A single set of embedded layers located either above of below the active layer 912 may also be used. Generally, the use of embedded layers above the active layer 912 results in better current confinement because current spreading effects are minimized.

Above the upper set of embedded layers, 916, 918, 920, is an upper cladding layer of AlInP 922. The indium mole fraction of this layer 922 is about 50% with a magnesium doping of $5 \times 10^{18}$ cm$^{-3}$. Afterwards, a p-type highly-doped InGaP cap layer 924 and a p-type GaAs cap layer 926 are deposited for the purpose of forming low resistance contacts. The indium content of the InGaP layer 924 is about 50%. The doping levels of the InGaP and GaAs cap layers, 924 and 926, are approximately $5 \times 10^{18}$ cm$^{-3}$ and $1 \times 10^{19}$ cm$^{-3}$ respectively.

Figure 10:
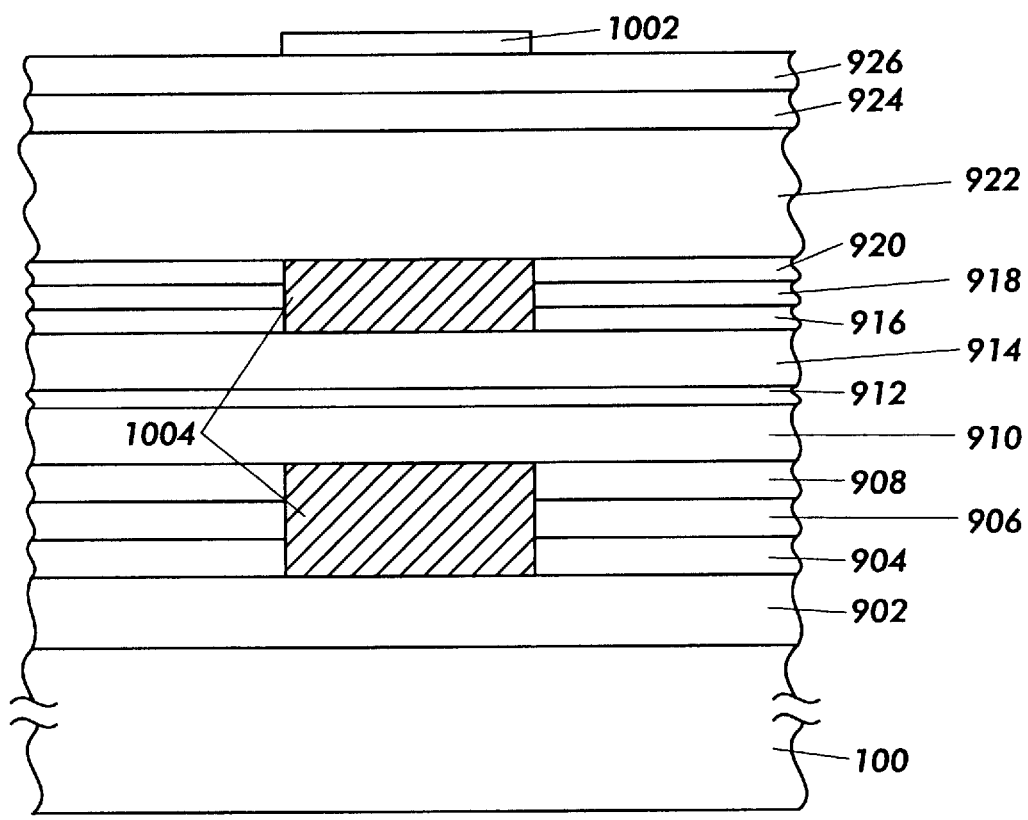
FIG. 10 illustrates a cross-sectional view of a laser structure shown in FIG. 9 which is used to implement another alternative embodiment of the present invention. It shows a region which has undergone a pre-oxidation layer disordering process.

After all the semiconductor layers shown in FIG. 9 have been formed, a silicon oxide cap 1002 is formed on the surface of the semiconductor sample as shown in FIG. 10.

The silicon oxide cap 1002 is used to define the boundaries of the intermixed region 1004 in a direction perpendicular to the surface of the substrate 100. After a typical annealing process is completed, the region of the AlAs layers 906 and 918 under the silicon oxide mask 1002 has an aluminum content of less than 100% while at the same time, regions under the silicon oxide mask 1002 in the AlGaAs layers 904, 908, 916 and 920 have a higher aluminum content. Minimal intermixing of Group III elements occurs under the areas not capped by silicon oxide 1002 since inadequate Group III vacancies are generally generated in these areas.

Figure 11:
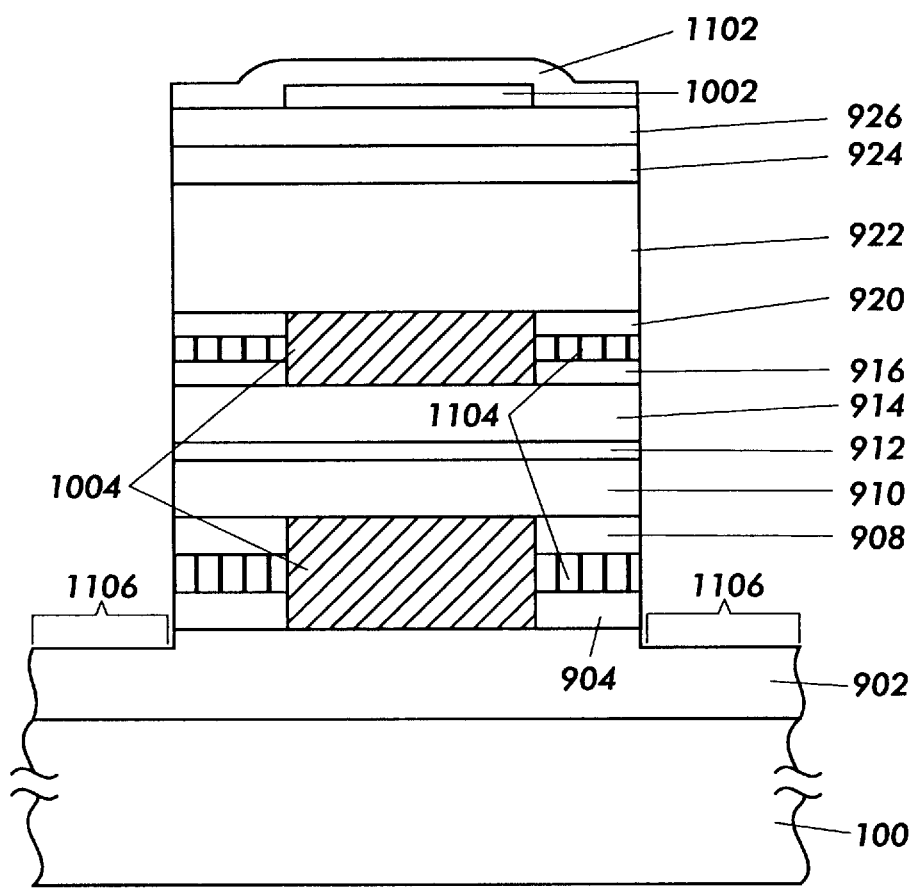
FIG. 11 illustrates a cross-sectional view of a laser structure shown in FIG. 10 which is used to implement another alternative embodiment of the present invention. It shows a region which has undergone an etching process which forms a mesa.

Afterwards, a silicon nitride layer ($Si_3N_4$) 1102 is deposited over the entire semiconductor sample. Other dielectric materials may also be used. Then, the nitride layer 1102 is patterned and etched, forming the structure shown in FIG. 11. The grooves 1106 shown in FIG. 11 form a mesa and expose the AlAs layers 906 along the sidewalls of the mesa. The sample then undergoes an oxidation step. Due to a difference between the mole fraction of the intermixed regions 1004 of the AlAs layers and the unintermixed remaining regions, a disparity in the oxidation rates of the two regions exists. Due to this significant difference in the oxidation rates between the intermixed regions 1002 and the remaining unintermixed regions of the AlAs layer, the oxidation process slows down substantially when it reaches the interface between the intermixed and unintermixed regions. As shown in FIG. 11, this approach results in oxide formation in regions 1104 of the AlAs layer. The boundaries of the regions 1104 shown in FIG. 11 are defined by the AlGaAs layers 904, 908, 916, and 920 in the direction parallel to the surface of the substrate 100 and by the silicon oxide cap 1002 in the direction perpendicular to the surface of the substrate 100.

Figure 12:
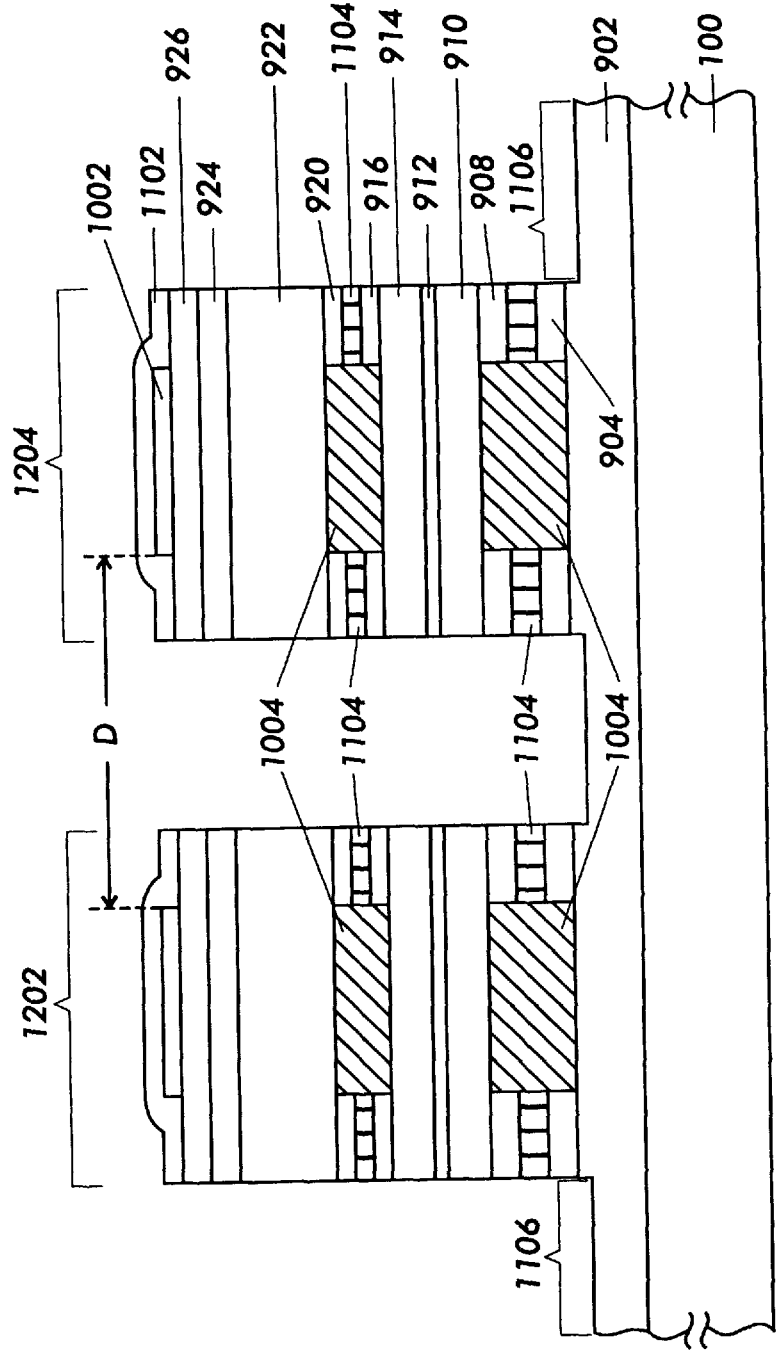
FIG. 12 illustrates a cross-sectional view of a two-laser array separated by a distance "D," which is the spacing between two regions which have undergone a layer disordering process.

FIG. 12 illustrates a cross-sectional view of two lasers, 1202 and 1204. The oxide regions 1104 in both lasers, 1202 and 1204, are formed by a layer disordering process, followed by an oxidation process. The distance "D" between the two intermixed regions 1004 of the lasers is determined by the distance between the two silicon oxide caps 1002. As previously discussed, since the intermixed regions 1004 are defined by the placement of the oxide caps 1002, which are formed by a photolithography and an etching process, their spacing can be defined in a consistent and reproducible manner. In addition, because of the ability of the photolithography process to form small linewidths, the spacing "D" can be minimal so that highly compact laser arrays can be formed.

The composition, dopants, doping levels, and dimensions given above are exemplary only, and variations in these parameters are permissible. Additionally, other layers in addition to the ones shown in the figures may also be included. Variations in experimental conditions such as intermixing temperature, time, and oxidation temperature are also permitted. Lastly, instead of GaAs and GaAlAs, other semiconductor materials such as GaAlSb, InAlGaP, or other III-V alloys may also be used.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. An edge-emitting laser, comprising:

(a) a substrate;

(b) a plurality of contiguous semiconductor layers on said substrate, one or more of said contiguous semiconductor layers forming an active layer of said edge-emitting laser, said active layer having a first surface and a second surface;

(c) a first confinement region and a second confinement region sandwiching said active layer to provide optical and carrier confinement in a direction perpendicular to the surface of said substrate;

(d) first lateral waveguiding region formed by a first oxidized region and a second lateral waveguiding region formed by a second oxidized region, wherein the distance between said first and second lateral waveguiding regions is defined by an intermixed region, said first and second lateral waveguiding regions providing confinement of the optical field in said edge-emitting laser in a direction parallel to the surface of said substrate;

(e) a cladding region adjacent to said first confinement region, said cladding region comprising a pair of oxidized regions formed substantially simultaneously with said first and said second oxidized regions, said pair of oxidized regions acting to provide confinement of electrons and holes; and (f) a first electrode which contacts one of said plurality of contiguous layers proximate to said first surface of said active layer and a second electrode which contacts one of said plurality of contiguous layers proximate to said second surface of said active layer.

2. The edge-emitting laser of claim 1 wherein said first and second oxide regions comprise a native oxide of an aluminum-containing semiconductor material.

3. The edge-emitting laser of claim 2 wherein said aluminum-containing semiconductor material comprises a disordering agent.

4. The edge-emitting laser of claim 3 wherein said disordering agent is silicon.

5. The edge-emitting laser of claim 3 wherein said disordering agent is magnesium.

6. The edge-emitting laser of claim 1 wherein said intermixed region is formed by a layer disordering process.

7. The edge-emitting laser of claim 1 wherein said intermixed region is proximate to said second surface of said active layer.

8. The edge-emitting laser of claim 1 wherein said edge-emitting laser further comprises a second intermixed region, said intermixed and second intermixed regions sandwiching said active layer.

9. The edge-emitting laser of claim 1 wherein said plurality of contiguous semiconductor layers comprises a phosphide-based material.

10. The edge-emitting laser of claim 1 wherein said plurality of contiguous semiconductor layers comprises an arsenide-based material.

11. The edge-emitting laser of claim 1 wherein said plurality of contiguous semiconductor layers comprises an aluminum-containing semiconductor embedded layer.

12. The edge-emitting laser of claim 1 wherein said substrate is GaAs.

13. An array of edge-emitting lasers, each edge-emitting laser comprising:

(a) a substrate;

(b) a plurality of contiguous semiconductor layers on said substrate, one or more of said contiguous semiconductor layers forming an active layer of said edge-emitting laser;

(c) a first electrode which contacts one of said plurality of contiguous layers above said active layer and a second electrode which contacts one of said plurality of contiguous layers below said active layer;

(d) a pair of regions sandwiching said active layer to provide optical and carrier confinement in a direction perpendicular to the surface of said substrate; and (e) a first lateral waveguiding region formed by a first oxidized region and a second lateral waveguiding region formed by a second oxidized region, wherein the distance between said first and second lateral waveguiding regions is defined by an intermixed region, said first and second lateral waveguiding regions providing confinement of the optical field in said edge-emitting laser in a direction parallel to the surface of said substrate whereby the spacing in said array of said edge-emitting lasers is determined by the distance between said intermixed region in each said edge-emitting laser, respectively.

14. The array of edge-emitting lasers of claim 13 wherein said first and second oxide regions comprise a native oxide of an aluminum-containing semiconductor material.

15. The array of edge-emitting lasers of claim 14 wherein said aluminum-containing semiconductor material comprises a disordering agent.

16. The array of edge-emitting lasers of claim 15 wherein said disordering agent is silicon.

17. The array of edge-emitting lasers of claim 15 wherein said disordering agent is magnesium.

18. The array of edge-emitting lasers of claim 13 wherein said intermixed region is formed by a layer disordering process.

19. The array of edge-emitting lasers of claim 14 wherein said intermixed region is above said active layer.

20. The array of edge-emitting lasers of claim 13 wherein said intermixed region is below said active layer.

21. The array of edge-emitting lasers of claim 13 wherein said each of said array of edge-emitting lasers further comprises a second intermixed region, said intermixed and second intermixed regions sandwiching said active layer.

22. The array of edge-emitting lasers of claim 13 wherein said plurality of contiguous semiconductor layers comprises a phosphide-based material.

23. The array of edge-emitting lasers of claim 13 wherein said plurality of contiguous semiconductor layers comprises an arsenide-based material.

24. The array of edge-emitting lasers of claim 13 wherein said plurality of contiguous semiconductor layers comprises an aluminum-containing semiconductor embedded layer.

* * * * *

UNITED STATES PATENT AND TRADEMARK OFFICE
CERTIFICATE OF CORRECTION

PATENT NO. : 5,886,370 Page 1 of 1
APPLICATION NO. : 08/864803
DATED : March 23, 1999
INVENTOR(S) : Decai Sun et al.

It is certified that error appears in the above-identified patent and that said Letters Patent is hereby corrected as shown below:

Column 1,
Line 12, insert as a new paragraph:
-- This invention was made with Government support under Agreement No. 70NANB2H1241 awarded by the Department of Commerce. The Government has certain rights in this invention. --.

Signed and Sealed this

Twentieth Day of June, 2006

JON W. DUDAS
*Director of the United States Patent and Trademark Office*